(12) United States Patent
Ichihashi et al.

(10) Patent No.: US 11,996,783 B2
(45) Date of Patent: May 28, 2024

(54) POWER CONVERTER

(71) Applicant: DENSO CORPORATION, Kariya (JP)

(72) Inventors: Katsuhiro Ichihashi, Nisshin (JP); Syuji Kurauchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 206 days.

(21) Appl. No.: 17/735,453

(22) Filed: May 3, 2022

(65) Prior Publication Data

US 2022/0263426 A1 Aug. 18, 2022

Related U.S. Application Data

(63) Continuation of application No. PCT/JP2020/041201, filed on Nov. 4, 2020.

(30) Foreign Application Priority Data

Nov. 8, 2019 (JP) .................................. 2019-203324

(51) Int. Cl.
*H05K 5/00* (2006.01)
*H02M 1/00* (2006.01)
*H02M 7/00* (2006.01)
*H05K 7/14* (2006.01)

(52) U.S. Cl.
CPC ......... *H02M 7/003* (2013.01); *H02M 1/0067* (2021.05); *H05K 7/1427* (2013.01)

(58) Field of Classification Search
CPC ... H02M 7/003; H02M 1/0067; H05K 7/1427

USPC .......................................................... 361/752
See application file for complete search history.

(56) References Cited

U.S. PATENT DOCUMENTS

2013/0301312 A1* 11/2013 Konishi ............ H02M 3/33573
363/21.15
2018/0182527 A1 6/2018 Fujita

FOREIGN PATENT DOCUMENTS

| JP | 2001-333577 A | 11/2001 |
| JP | 2013-021748 A | 1/2013 |
| JP | 2015-201964 A | 11/2015 |

* cited by examiner

*Primary Examiner* — Binh B Tran
(74) *Attorney, Agent, or Firm* — Oliff PLC

(57) ABSTRACT

A power converter includes a plurality of ports provided to a housing, a plurality of conversion circuit electrically connected to the respective ports, and a plurality of coils electrically connected to the respective power conversion circuits and wound around a transformer core. The plurality of coils including a predetermined first coil electrically connected to a predetermined conversion circuit and a second coil. The conversion circuit is mounted to a predetermined board, while the first coil is fixed along the periphery of a board hole of the predetermined board. The predetermined board is fixed to the housing in the state in which the transformer core is inserted into the board hole to determine the position of the predetermined coil relative to the second coil.

16 Claims, 5 Drawing Sheets

POWER CONVERTER

CROSS-REFERENCE TO RELATED APPLICATION

The present application is a continuation application of International Application No. PCT/JP2020/041201, filed on Nov. 4, 2020, which claims priority to Japanese Patent Application No. 2019-203324, filed on Nov. 8, 2019. The contents of these applications are incorporated herein by reference in their entirety.

BACKGROUND

Technical Field

The present disclosure relates to power converters having a plurality of ports, which transform power inputted from any of the ports and output the transformed power from a different port.

Background Art

Intelligent modules integrating a plurality of circuits include ones configured as shown below. Specifically, some intelligent modules include a common board and a customized board. On the common board, a circuit that can be commonly used between many customers is mounted. On the customized board, a circuit having a configuration or layout that can be different depending on customer specifications is mounted.

SUMMARY

In the present disclosure, provided is a power converter as the following.

The power converter includes a plurality of ports provided to a housing, a plurality of conversion circuit electrically connected to the respective ports, and a plurality of coils electrically connected to the respective power conversion circuits and wound around a transformer core. The plurality of coils including a predetermined first coil electrically connected to a predetermined conversion circuit and a second coil. The conversion circuit is mounted to a predetermined board, while the first coil is fixed along the periphery of a board hole of the predetermined board. The predetermined board is fixed to the housing in the state in which the transformer core is inserted into the board hole to determine the position of the predetermined coil relative to the second coil.

BRIEF DESCRIPTION OF THE DRAWINGS

The aim set forth above and other aims, features, and advantageous effects of the present disclosure will be made clearer by the following detailed description given referring to the accompanying drawings. In the drawings.

DETAILED DESCRIPTION OF THE PREFERRED EMBODIMENTS

Figure 1:
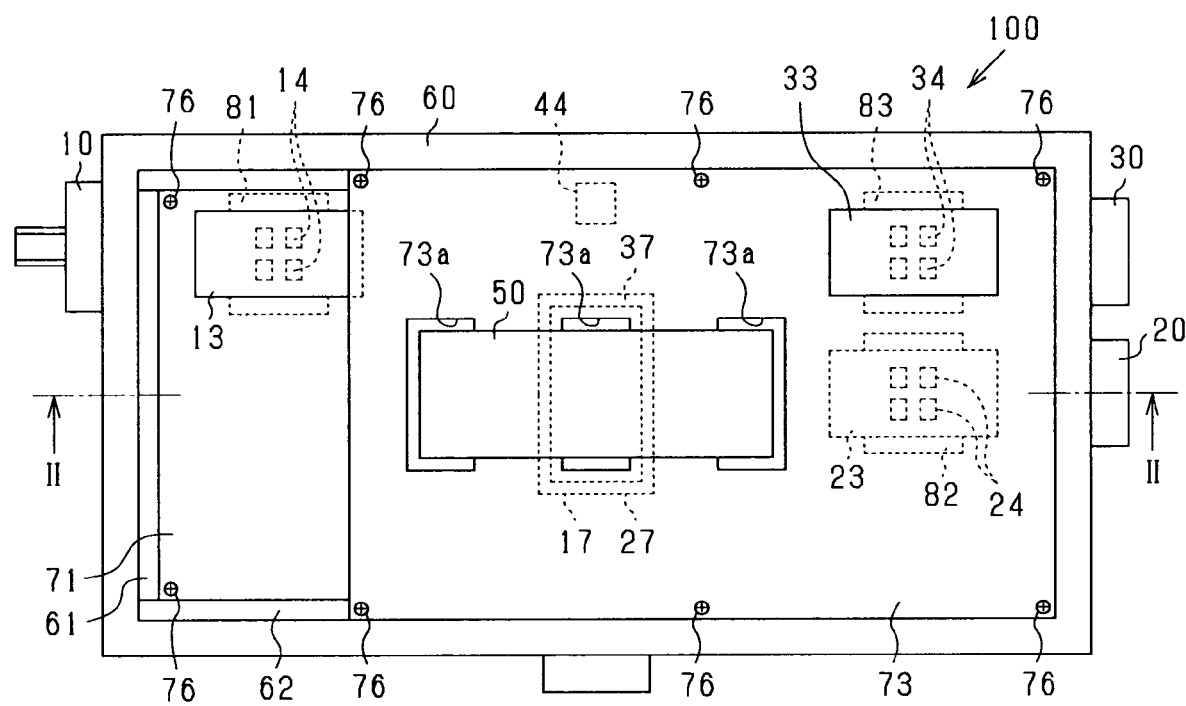
FIG. 1 is a plan view illustrating a power converter according to a first embodiment.

Such a technique about the intelligent modules integrating a plurality of circuits is shown, for example, in PTL 1 provided below.

[PTL 1] JP 2013-21748 A

According to the above technique, only replacement of the customized board can easily change the circuit which is required to be changed according to the customer specification. Therefore, customizability can be secured. However, the present disclosers have focused on the following issues that may arise if the technique of changing part of the circuits in this way is applied to predetermined power converters.

Specifically, in such predetermined power converters, transformation is performed through a plurality of coils wound about a transformer core. In this type of power converters, change of part of the circuits according to customer needs or the like may change the magnetic coupling degree required between the coils. Specifically, in the case of a specification in which the power is desired to be efficiently transmitted between the coils, a high magnetic coupling degree near 100% is required. On the other hand, in the case of a specification in which the voltage generated in an output side coil is desired to be stabilized, a magnetic coupling degree slightly lower than 100% is required.

Therefore, in power converters in which the transformation is performed through a plurality of coils, change of part of the circuits according to customer needs may lead to the necessity of readjusting the magnetic coupling degree between the coils. However, such readjustment of magnetic coupling degree is not considered in the intelligent module described in PTL 1 or the like.

The present disclosure has been made in light of the circumstances set forth above and mainly aims to facilitate change of part of a plurality of circuits according to customer needs and facilitate readjustment of magnetic coupling degree between the coils, in a power converter in which the transformation is performed through the plurality of coils.

A power converter according to the present disclosure includes a housing, a plurality of ports, a plurality of conversion circuits, and a plurality of coils. The plurality of ports are provided to the housing. The plurality of conversion circuits are provided to the respective ports, with each of the conversion circuits electrically connected to a corresponding one of the ports. The plurality of coils are provided to the respective conversion circuits, with each of the coils electrically connected to a corresponding one of the conversion circuits and wound around a predetermined transformer core.

In the power converter, each conversion circuit performs conversion between DC or AC used on the port side and AC having a predetermined frequency to transmit AC power having the predetermined frequency between the coils, using magnetic coupling, and to perform transformation with the transmission.

The power converter includes a predetermined first board in which a predetermined first board hole is formed. The plurality of conversion circuits include a predetermined first conversion circuit mounted to the first board. The plurality of coils include a predetermined first coil electrically connected to the first conversion circuit and a second coil. The first coil is fixed along the first board hole of the first board, in a state in which the first coil moves together with the first board. Furthermore, the first board is fixed to the housing in the state in which the transformer core is inserted into the first board hole to determine a position of the first coil relative to the second coil.

According to the present disclosure, since the first conversion circuit and the first coil are mounted to the first board, replacement of only the first board with another board can easily replace the first conversion circuit together with the first coil in a set. Therefore, the first conversion circuit and the first coil can be easily changed according to customer requirements.

Furthermore, since the first coil moves with the first board, only position adjustment of the first board can adjust the position of the first coil, so that the magnetic coupling degree between the first coil and the second coil can be adjusted. Thus, a desired magnetic coupling degree can be achieved by only placing the first board at a position corresponding to the desired magnetic coupling degree.

As described above, in a power converter in which the transformation is performed through a plurality of coils, part of the circuits can be easily changed according to customer requirements or the like, and the magnetic coupling degree between the coils can be easily readjusted.

Referring to the drawings, some embodiments of the present disclosure will be described. It should be noted, however, that the present disclosure should not be construed as being limited to these embodiments but may be appropriately modified and implemented within the scope not departing from the spirit of the present disclosure.

First Embodiment

FIG. 1 is a plan view illustrating a power converter 100 according to the present embodiment. The power converter 100 is installed in a vehicle. The power converter 100 includes a housing 60, first to third ports 10, 20, 30, first to third conversion circuits 13, 23, 33, first to third coils 17, 27, 37, a transformer core 50, a main board 71, and a sub-board 73.

Figure 2:
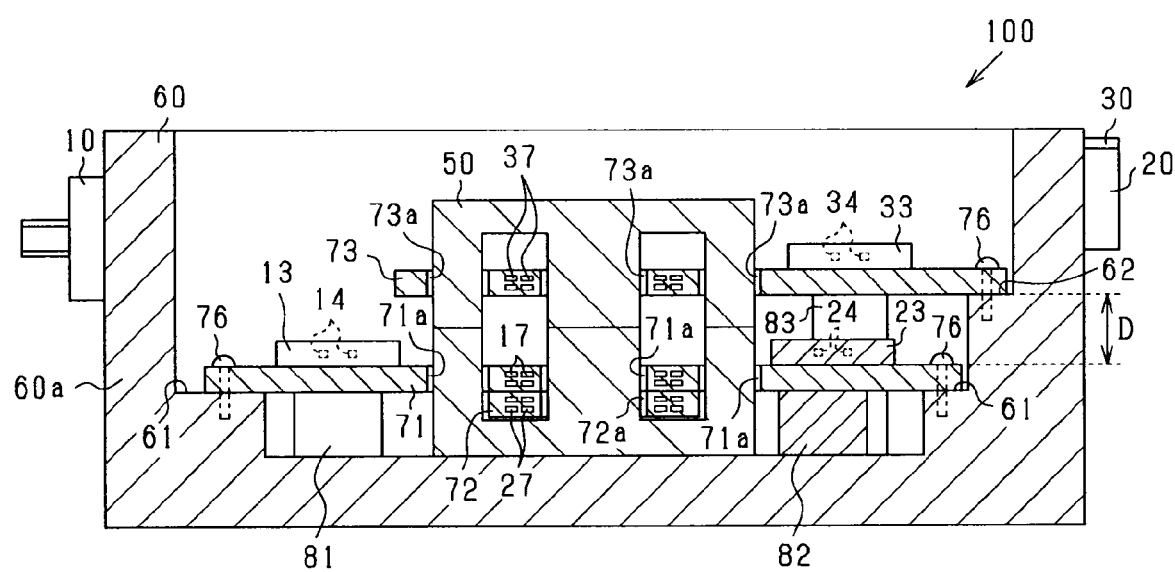
FIG. 2 is cross-sectional view taken along the line II-II of FIG. 1.

FIG. 2 is cross-sectional view taken along the line II-II of FIG. 1. One way in the thickness direction of the main board 71 and the sub-board 73, conforming to the drawings, will be termed upper hereinafter, and the other way in the thickness direction will be termed lower hereinafter. However, the converter 100 can be set up with the upper, which will be mentioned below, being lower, and the upper and the lower, which will be mentioned below, being on horizontal sides.

The housing 60 includes a box-shaped housing body 60a which is open in the upper direction, and a cover (not shown) attached to the upper portion of the housing body 60a. The transformer core 50 has a lower portion which is fixed to the inner bottom portion of the housing 60.

A coil board 72 is mounted to the main board 71. The main board 71 is provided with a first board hole 71a. The coil board 72 is provided with a second board hole 72a. The sub-board 73 is provided with a third board hole 73a. The first to third board holes 71a, 72a, 73a, which are vertically formed through the respective boards 71, 72, 73, are used for inserting the transformer core 50 therethrough. The transformer core 50 is formed being divided into an upper portion and a lower portion so that the boards 71, 72, 73 can be mounted thereto.

The first coil 17 is embedded in the main board 71 while being wound around the periphery of the first board hole 71a. Accordingly, the first coil 17 is fixed to the main board 71 in the state in which the first coil 17 can move with the main board 71.

The second coil 27 is embedded in the coil board 72 while being wound around the periphery of the second board hole 72a. The coil board 72 is fixed to the main board 71. Accordingly, the second coil 27 is fixed to the main board 71 via the coil board 72 in the state in which the second coil 27 can move with the main board 71.

The third coil 37 is embedded in the sub-board 73 while being wound around the periphery of the third board hole 73a. Accordingly, the third coil 37 is fixed to the sub-board 73 in the state in which the third coil 37 can move with the sub-board 73.

The main board 71 is fixed to the housing 60, with the transformer core 50 inserted to the first and second board holes 71a and 72a. Specifically, the housing 60 has an inner wall portion in which a first support portion 61 is formed, so that the main board 71 can be fixed to the first support portion 61 via screws 76. Thus, the first and second coils 17 and 27 are fixed in the state of being wound around the transformer core 50.

The sub-board 73 is fixed to the housing 60, with the transformer core 50 inserted to the third hole 73a. Specifically, the housing 60 has an inner wall portion in which a second support portion 62 is formed, with a step formed between itself and the first support portion 61, so that the sub-board 73 can be fixed to the second support portion 62 via screws 76. Thus, the sub-board 73 is set up parallel to the main board 71. Furthermore, the third coil 37 is fixed in the state of being wound around the transformer core 50, while being positioned relative to the first and second coils 17 and 27.

If current is passed through any one of the first to third coils 17, 27, 37, magnetic flux is generated in the transformer core 50 due to the current. If the current is alternating current (AC), the magnetic flux generated in the transformer core 50 varies and the magnetic flux variation generates inductive voltage in the coils 17, 27, 37. Thus, AC power is transmitted between the coils 17, 27, 37 due to magnetic coupling. While being transmitted, the AC power is transformed according to the ratio of the number of turns of the coils 17, 27, 37, and the degree of magnetic coupling between the coils 17, 27, 37.

The first port 10 is provided to a predetermined outer surface of the housing 60, with a predetermined low voltage circuit (not shown) electrically connected thereto. The low voltage circuit is a direct current (DC) circuit having a low voltage power source, such as a lead battery, and having loads of various on-vehicle electrical devices and the like.

The first conversion circuit 13 is mounted to the main board 71 and electrically connected to the first port 10 and the first coil 17. When DC power is inputted to the first port 10 from the low voltage circuit, the first conversion circuit 13 converts the DC power to AC power having a predetermined frequency to supply the converted power to the first coil 17. On the other hand, when DC power is outputted to the low voltage circuit from the first port 10, the first conversion circuit 13 converts the AC power having a predetermined frequency supplied from the first coil 17 to DC power to supply the converted power to the first port 10. Specifically, the first conversion circuit 13 is an inverter circuit having four semiconductor switches 14. With the four semiconductor switches 14 being controlled, bidirectional conversion is performed as appropriate between DC and AC having the predetermined frequency.

The second port 20 is provided to an outer surface of the housing 60 facing away from the surface to which the first port 10 is provided. The second port 20 is electrically connected to a predetermined high voltage circuit (not shown). The high voltage circuit is a DC circuit having a high voltage power source, such as a lithium battery, and having loads, such as an inverter, which drive the rotary electric machine for rotating the wheels.

The second conversion circuit 23 is mounted to the main board 71 and electrically connected to the second port 20 and the second coil 27. When DC power is inputted to the second port 20 from the high voltage circuit, the second conversion circuit 23 converts the DC power to AC power having a predetermined frequency to supply the converted power to the second coil 27. On the other hand, when DC power is outputted to the high voltage circuit from the second port 20, the second conversion circuit 23 converts the AC power having the predetermined frequency supplied from the second coil 27 to DC power to supply the converted power to the second port 20. Specifically, the second conversion circuit 23 is an inverter circuit having four semiconductor switches 24. With the four semiconductor switches 24 being controlled, bidirectional conversion is performed as appropriate between DC and AC having the predetermined frequency.

The third port 30 is provided to the outer surface of the housing 60 to which the second port 20 is provided. The third port 30 is electrically connected to a predetermined customized circuit. The customized circuit is a circuit additionally provided to the vehicle as a customer option. Examples of the customized circuit provided as a customer option may include a circuit having loads such as a heater for warming catalysts or the steering wheel, a circuit having loads such as optional indicators, a circuit having power sources such as a solar panel, and a circuit having power sources such as a booster battery.

The third conversion circuit 33 is mounted to the sub-board 73 and electrically connected to the third port 30 and the third coil 37. The third conversion circuit 33 is appropriately selected according to the mode of the customized circuit. Thus, the mode of the third conversion circuit 33 is varied.

As a mode of the third conversion circuit 33, there is a mode in which the customized circuit is a DC circuit. When DC power is inputted to the third port 30 from the customized circuit, the third conversion circuit 33 converts the DC power to AC power having a predetermined frequency to supply the converted power to the third coil 37. When DC power is outputted to the customized circuit from the third port 30, the third conversion circuit 33 converts AC power having the predetermined frequency supplied from the third coil 37 to DC power to supply the converted power to the third port 30. Specifically, the third conversion circuit 33 is an inverter circuit having four semiconductor switches 34. With the four semiconductor switches 34 being controlled, bidirectional conversion is performed as appropriate between DC and AC having the predetermined frequency. It should be noted that FIGS. 1 and 2 show the case where the third conversion circuit is of this mode.

As another mode of the third conversion circuit 33, there is a mode in which the customized circuit is an AC circuit. When AC power is inputted to the third port 30 from the customized circuit, the third conversion circuit 33 converts the AC power (e.g., 50 Hz or 60 Hz) to AC power having a predetermined frequency (e.g., several hundred kHz) to supply the converted power to the third coil 37. When AC power is outputted to the customized circuit from the third port 30, the third conversion circuit 33 converts AC power having the predetermined frequency supplied from the third coil 37 to AC power having a predetermined frequency used in the customized circuit to supply the converted power to the third port 30.

Specifically, in this case, the third conversion circuit 33 includes a first AC-DC conversion circuit that performs conversion between AC (e.g., 50 Hz or 60 Hz) inputted from the customized circuit and DC, and a second AC-DC conversion circuit that performs conversion between the converted DC and AC having the predetermined frequency (e.g., several hundred kHz). The first and second AC-DC conversion circuits are both inverter circuits each having four semiconductor switches. The third conversion circuit 33 including the first and second AC-DC conversion circuits performs bidirectional conversion as appropriate between AC having a frequency used in the customized circuit and AC having the above predetermined frequency.

As still another mode of the third conversion circuit 33, there is a mode in which the customized circuit is a DC circuit having loads only, without having any power source, while the third port 30 is dedicated to outputting power, without inputting power. Therefore, the third conversion circuit 33 is a rectifier circuit having four diodes, which unidirectionally converts AC power having the predetermined frequency supplied from the third coil 37 to DC power and supplies the converted power to the third port 30.

As described above, the third conversion circuit 33 can have several modes, and thus an appropriate one of them is required to be selected and set up according to the mode of the customized circuit. Also for the third coil 37, an appropriate mode, such as the number of turns, is required to be selected and set up according to the mode of the customized circuit.

Hereinafter, peripheral structures of the structure described above will be described. As shown in FIG. 1, a first heat dissipation element 81 is disposed, in plan view, at a position aligning with the semiconductor switches 14 of the first conversion circuit 13. Also, a second heat dissipation element 82 is disposed, in plan view, at a position aligning with the semiconductor switches 24 of the second conversion circuit 23. Furthermore, a third heat dissipation element 83 is disposed, in plan view, at a position aligning with the semiconductor switches 34 of the third conversion circuit 33.

As shown in FIG. 2, the first heat dissipation element 81, which is disposed under the semiconductor switches 14, abuts against the main board 71 or an object mounted thereto, while abutting against the housing 60. Also, the second heat dissipation element 82, which is disposed under the semiconductor switches 24, abuts against the main board 71 or an object mounted thereto, while abutting against the housing 60. Furthermore, the third heat dissipation element 83, which is disposed under the semiconductor switches 34, abuts against the sub-board 73 or an object mounted thereto, while abutting against the housing 60. The housing 60 is provided with cooling means (not shown), such as water passages or air-cooling fins. Therefore, the temperature of the housing 60 becomes lower than the temperatures of the semiconductor switches 14, 24, 34 of the conversion circuits 13, 23, 33. Accordingly, heat which is generated by the semiconductor switches 14, 24, 34 is transferred to the housing 60 via the heat dissipation elements 81, 82, 83 and dissipated.

As shown in FIG. 1, the sub-board 73 is positioned above a noise source 44 aligning therewith, to cover the noise source 44 with the rear surface of the sub-board 73. The noise source 44 may be, for example, an electrical device that generates noise, such as an ECU for controlling the semiconductor switches 14, 24, 34, or a high-order ECU for controlling the ECU controlling the semiconductor switches 14, 24, 34.

Figure 3:
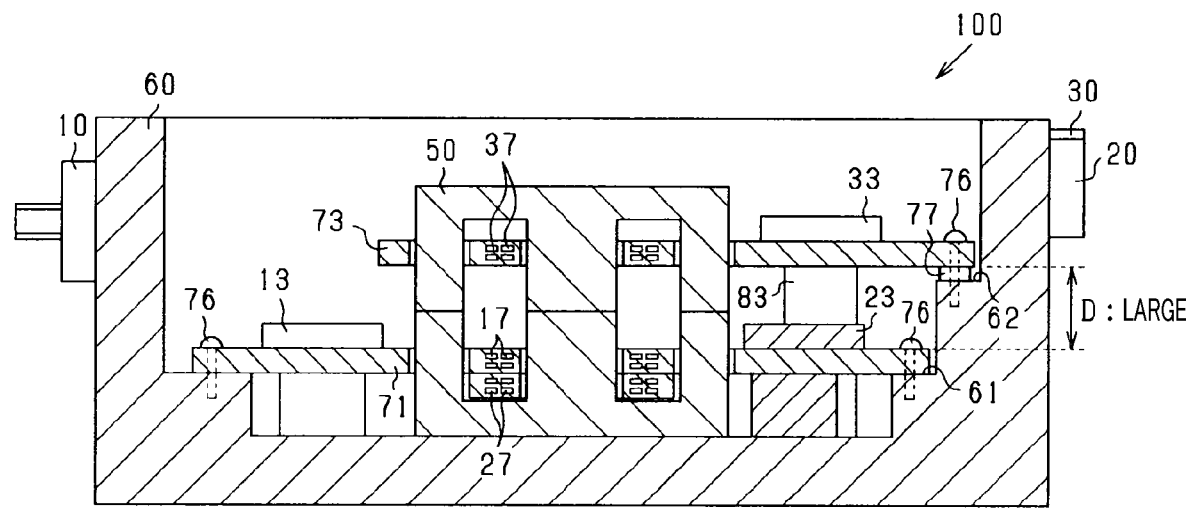
FIG. 3 is a front cross-sectional view illustrating a state in which a spacer is interposed between a housing and a sub-board.

FIG. 3 is a front cross-sectional view illustrating a state in which the sub-board 73 is fixed to the second support portion 62 via the screws 76, with a spacer 77 interposed between the second support portion 62 and the sub-board 73. In the following description, the distance between the main board 71 and the sub-board 73 is termed board-to-board distance D. With the spacer 77 interposed between the second support portion 62 and the sub-board 73, the board-to-board distance D can be increased compared to the case where there is no such interposition. Furthermore, if a spacer having a larger thickness is selected as the spacer 77 to be interposed, the board-to-board distance D can be further increased.

Since the third coil 37 moves with the sub-board 73, such increase of the board-to-board distance D can also increase the distances from the first and second coils 17 and 27 to the third coil 37. Accordingly, the magnetic coupling degree of the third coil 37 with respect to the first and second coils 17 and 27 decreases. In this case, the length of the third heat dissipation element 83 may be increased in the vertical direction by an amount corresponding to the thickness of the spacer 77, compared to one shown in FIG. 2, to cope with the increase in board-to-board distance D.

Figure 4:
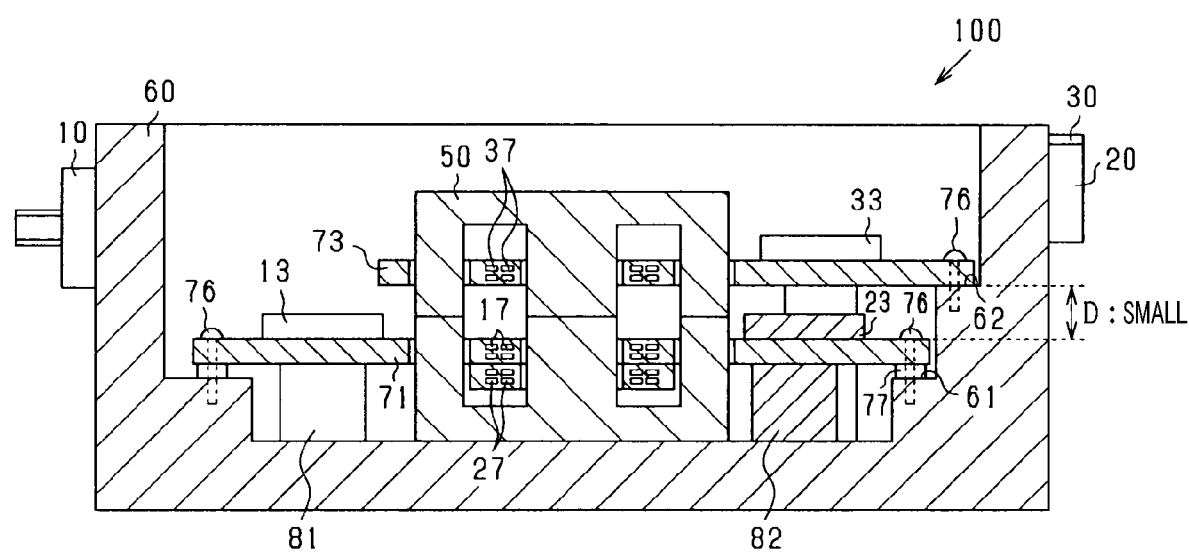
FIG. 4 is a front cross-sectional view illustrating a state in which a spacer is interposed between a housing and a main board.

FIG. 4 is a front cross-sectional view illustrating a state in which the main board 71 is fixed to the first support portion 61 via the screws 76, with a spacer 77 interposed between the first support portion 61 and the main board 71. With the spacer 77 interposed between the first support portion 61 and the main board 71, the board-to-board distance D can be decreased compared to the case where there is no such interposition. Furthermore, if a spacer having a larger thickness is selected as the spacer 77 to be interposed, the board-to-board distance D can be further decreased.

Since the first and second coils 17 and 27 move with the main board 71, such decrease of the board-to-board distance D can also decrease the distances from the first and second coils 17 and 27 to the third coil 37. Accordingly, the magnetic coupling degree of the third coil 37 with respect to the first and second coils 17 and 27 increases. In this case, the lengths of the first and second heat dissipation elements 81 and 82 may be increased in the vertical direction by an amount corresponding to the thickness of the spacer 77, compared to ones shown in FIG. 2, to cope with the decrease in board-to-board distance D.

Figure 5:
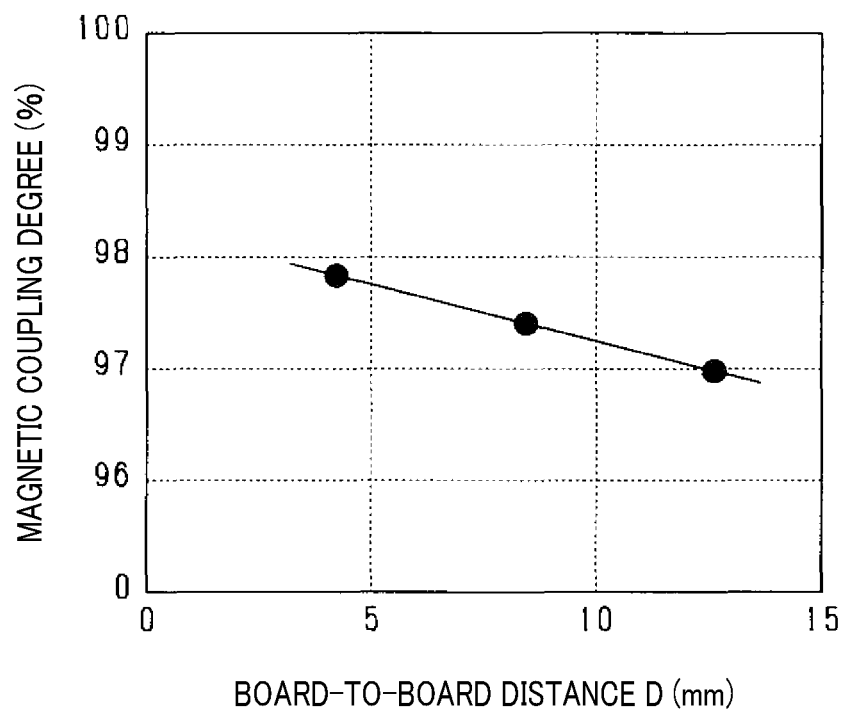
FIG. 5 is a graph showing a relationship between board-to-board distance and magnetic coupling degree.

FIG. 5 is a graph showing a relationship between board-to-board distance D and magnetic coupling degree of the third coil 37 with respect to the first coil 17. As shown, as the board-to-board distance D decreases, the magnetic coupling degree increases, and as the board-to-board distance D increases, the magnetic coupling degree decreases. Accordingly, the magnetic coupling degree can be adjusted by adjusting the board-to-board distance D.

According to the present embodiment, the following advantageous effects can be achieved. As described above, the mode of the third conversion circuit 33 and that of the third coil 37 are required to be appropriately changed according to the mode of the customized circuit. In this regard, since the third conversion circuit 33 and the third coil 37 are mounted to the sub-board 73, replacement of only the sub-board 73 with another board can easily replace the third conversion circuit 33 together with the third coil 37 in a set. Thus, the third conversion circuit 33 and the third coil 37 can be easily changed according to the mode of the customized circuit, i.e., customer requirements.

Furthermore, since the third coil 37 moves with the sub-board 73, only position adjustment of the sub-board 73 can adjust the position of the third coil 37, so that the magnetic coupling degree between the third coil 37 and other coils 17 and 27 can be adjusted. Thus, a desired magnetic coupling degree can be achieved by only placing the sub-board 73 at a position corresponding to the desired magnetic coupling degree.

Furthermore, since the first and second coils 17 and 27 move with the main board 71, only position adjustment of the main board 71 can adjust the positions of the first and second coils 17 and 27, so that the magnetic coupling degree of the third coil 37 with respect to the first and second coils 17 and 27 can be adjusted. Thus, magnetic coupling degree can be adjusted by the placement of not only the sub-board 73 but also the main board 71.

With the spacer 77 interposed between the main board 71 and the first support portion 61 or between the sub-board 73 and the second support portion 62, the board-to-board distance D can be easily adjusted. Accordingly, the magnetic coupling degree of the third coil 37 with respect to the first and second coils 17 and 27 can be easily adjusted.

Furthermore, in the configuration, the spacer 77 can be interposed between the sub-board 73 and the second support portion 62 or between the main board 71 and the first support portion 61. If the spacer 77 is interposed between the sub-board 73 and the second support 62, the board-to-board distance D increases compared to the case where there is no interposition of the spacer 77. If the spacer 77 is interposed between the main board 71 and the first support 61, the board-to-board distance D decreases compared to the case where there is no interposition of the spacer 77. Therefore, the board-to-board distance D can be increased or decreased from the normal state where the spacer 77 is not used.

Furthermore, the board-to-board distance D in the normal state of not using the spacer 77 can be set by determining the size of the step between the first and second support portions 61 and 62.

Also, since the heat generated in the semiconductor switches 14, 24, 34 of the first to third conversion circuits 13, 23, 33 transfers to the housing 60 via the heat dissipation elements 81, 82, 83, heat dissipation of the semiconductor switches 14, 24, 34 is enhanced. Furthermore, if the placement of the main board 71 or the sub-board 73 is changed in the vertical direction, the vertical displacement can be compensated by changing the heat dissipation elements 81, 82, 83 with those which have different heights accordingly.

In addition, since the rear surface of the sub-board 73 is located above the noise source 44 for covering, propagation of the noise generated by the noise source 44 to the surrounding circuits or the like can be minimized.

Second Embodiment

Next, a second embodiment will be described. In the following embodiments, the components identical with or similar to those in the previous embodiment are given the same reference signs. The present embodiment will be described based on the first embodiment, focusing on differences therefrom.

Figure 6:
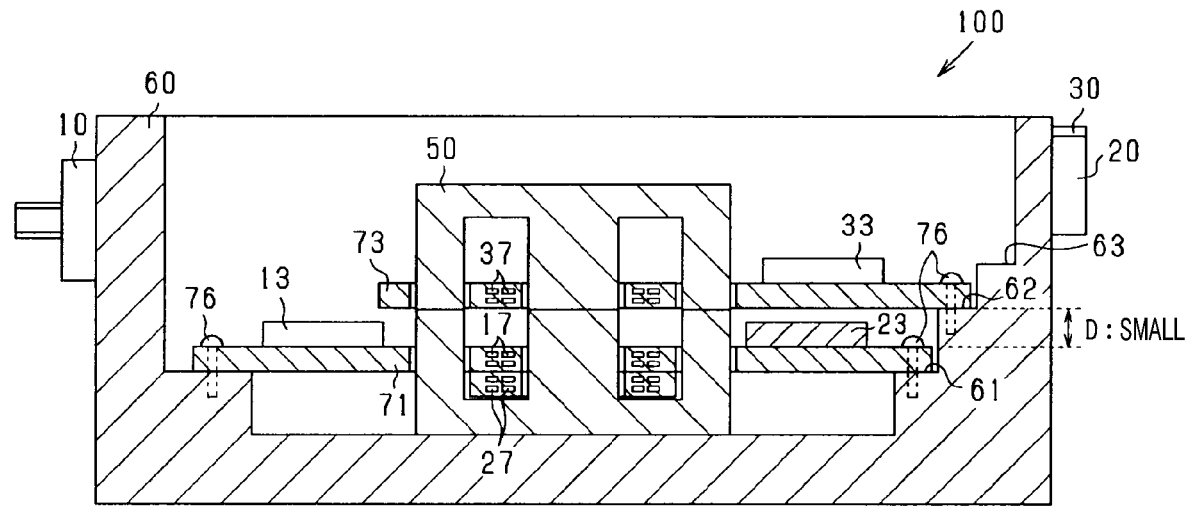
FIG. 6 is a front cross-sectional view illustrating a power converter according to a second embodiment.
Figure 7:
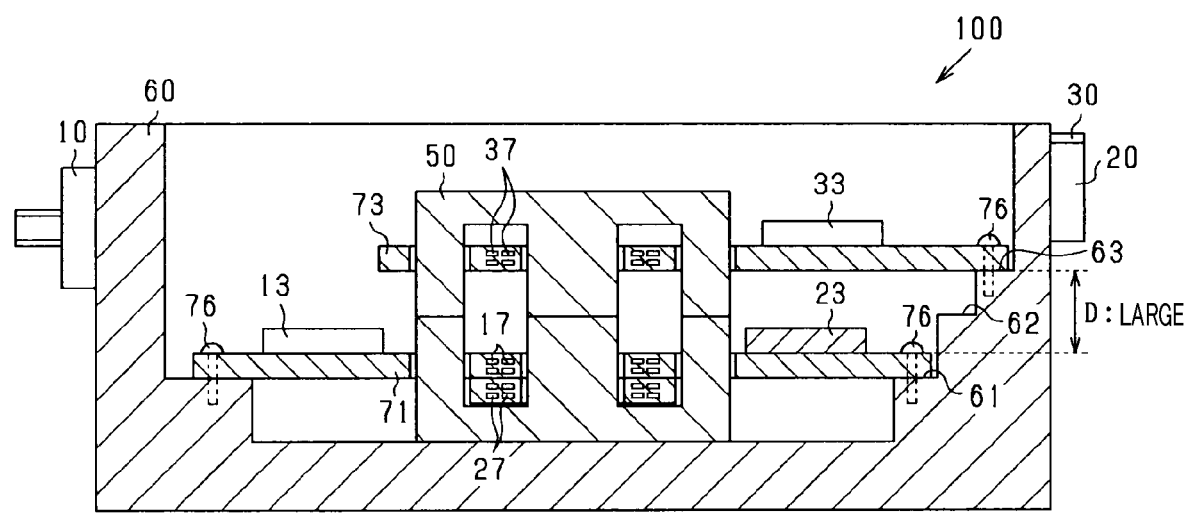
FIG. 7 is a front cross-sectional view illustrating a state in which the placement of the sub-board has been shifted upward.

FIGS. 6 and 7 are front cross-sectional views illustrating a power converter 100 according to the present embodiment. The housing 60 has an inner wall portion in which a third support portion 63 is formed, in addition to the first and second support portions 61 and 62. Specifically, in the inner wall portion of the housing 60, the third support portion 63 is formed, with a step formed between itself and the second support portion 62. As the sub-board 73, there is a sub-board 73 for the second support portion 62 as shown in FIG. 6 which is mounted to the second support portion 62, or a sub-board 73 for the third support portion 63 as shown in FIG. 7 which is larger than the former and mounted to the third support portion 63. A size of the sub-board 73 is changed according to the support portion 62 or the support portion 63 to which the sub-board 73 is mounted.

According to the present embodiment, the board-to-board distance D can be changed by changing the mounting portion of the sub-board 73 to the support portion 62 or the support portion 63. The following advantageous effects can also be achieved. Since the sub-board 73 for the second support portion 62 is different in size from the sub-board 73 for the third support portion 63, the sub-board 73 for the second support portion 62 cannot be mounted to the third support portion 63, or the sub-board 73 for the third support portion 63 cannot be mounted to the second support portion 62. Therefore, the sub-board 73 is prevented from being mounted to a wrong place when assembling the power converter 100, and thus the magnetic coupling degree of the third coil 37 with respect to the first and second coils 17 and 27 is prevented from becoming different from what has been intended.

Third Embodiment

Next, a third embodiment will be described. The present embodiment will be described based on the first embodiment, focusing on differences therefrom.

Figure 8:
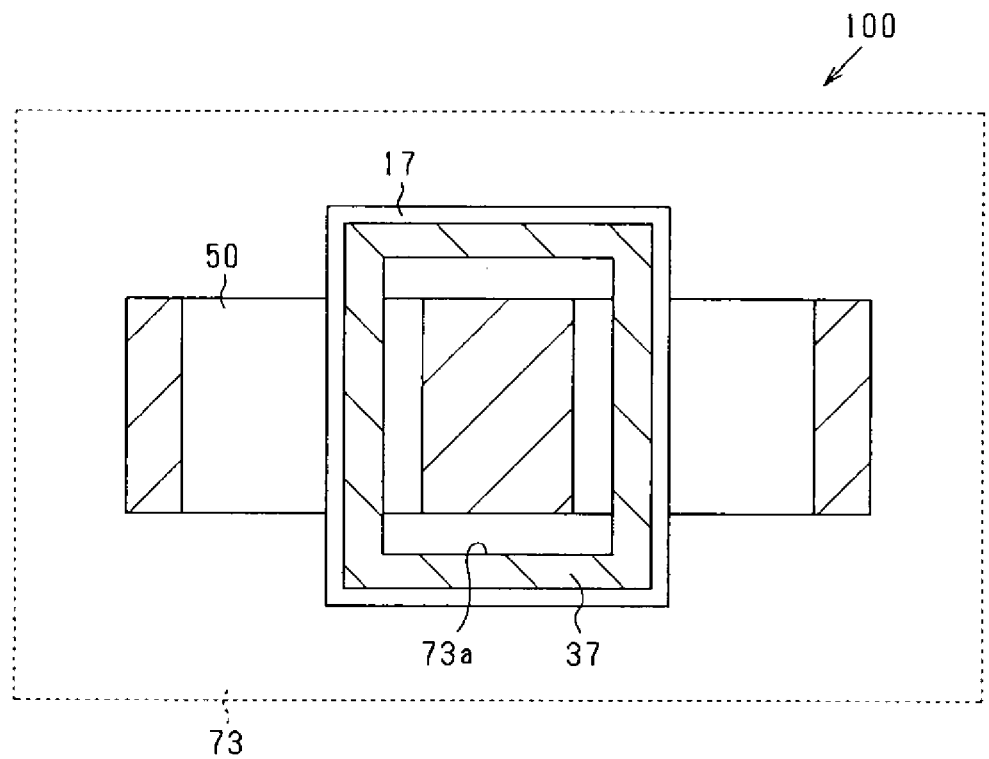
FIG. 8 is a plan view illustrating a power converter according to a third embodiment.
Figure 9:
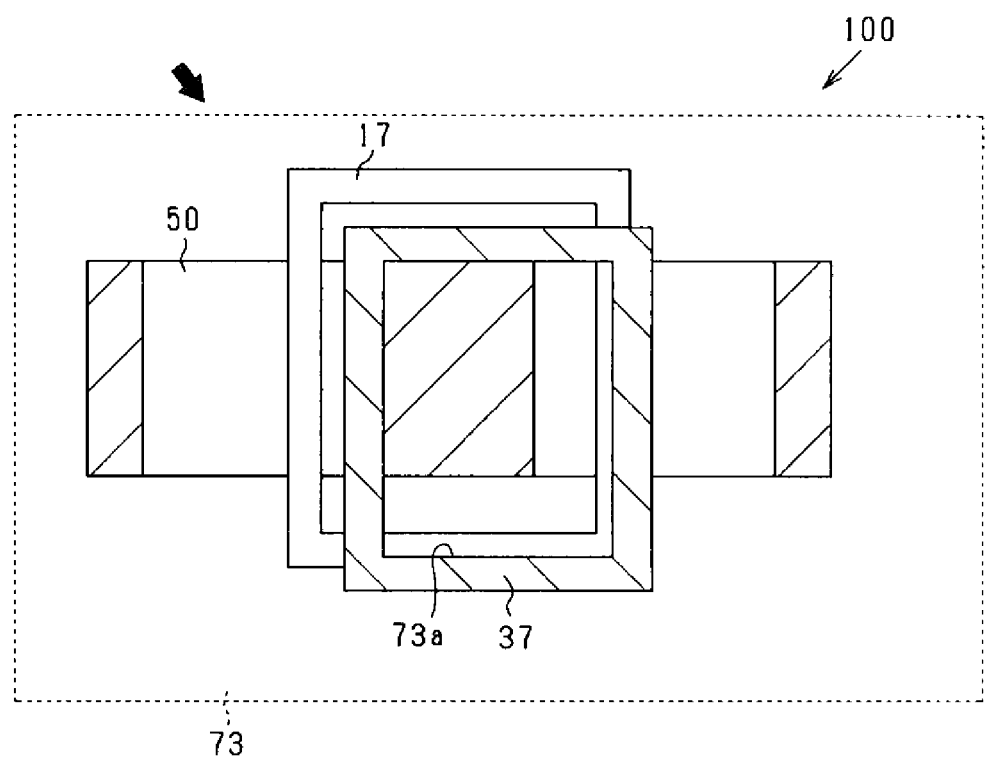
FIG. 9 is a plan view illustrating a state in which the placement of the sub-board has been shifted in the horizontal direction.

FIGS. 8 and 9 are plan views illustrating a power converter 100 according to the present embodiment. In these figures, the sub-board 73 is shown by a broken line and the main board 71 is omitted, so that the coils 17 and 37 can be seen.

The sub-board 73 is mounted so as to be adjustable in position in the horizontal direction. Such a configuration can be achieved by, for example, forming long holes as screw holes in the sub-board 73 to extend in the horizontal direction, and inserting screws 76 in the respective long holes to threadably attach the sub-board 73 to the housing 60. Also, for example, this configuration can also be achieved by forming screw holes in the housing 60 for mounting the sub-board 73 at a predetermined first position, and forming screw holes in the housing 60 for mounting the sub-board 73 at a second or third position horizontally shifted from the first position.

Thus, the magnetic coupling degree may be adjusted by adjusting the position of the sub-board 73 in the horizontal direction. Specifically, as shown in FIG. 8, if the third coil 37 aligns with the first coil 17 in plan view, the magnetic coupling degree of the third coil 37 with respect to the first coil 17 may become higher. However, as shown in FIG. 9, if the third coil 37 is deviated from the first coil 17 in plan view, the magnetic coupling degree of the third coil 37 with respect to the first coil 17 may become lower.

According to the present embodiment, the magnetic coupling degree of the third coil 37 with respect to the first and second coils 17 and 27 can be adjusted by adjusting the placement of the sub-board 37 in the horizontal direction, i.e., in the direction orthogonal to the penetration direction of the board hole 73a.

Other Embodiments

The embodiments described above can be modified and implemented as follows. For example, the power converter 100 may be installed in fixed objects other than vehicles.

Alternatively, for example, a DC circuit other than the low voltage circuit or the high voltage circuit may be electrically connected to the first port 10 or the second port 20. Alternatively, for example, the first conversion circuit 13 or the second conversion circuit 23 may be an AC-AC conversion circuit which performs conversion between the frequency used on the port 10, 20 side and the predetermined frequency used on the coil 17, 27 side, and an AC circuit may be electrically connected to the first port 10 or the second port 20. Alternatively, for example, the first port 10 or the second port 20 may be dedicated to output use, and the first conversion circuit 13 or the second conversion circuit 23 may be a rectifier circuit which unidirectionally converts AC supplied from the coil 17, 27 to DC.

Alternatively, for example, instead of mounting two sets of conversion circuit 13, 23 and coil 17, 27 to the main board 71, only one set, or three or more sets may be mounted thereto. Alternatively, for example, instead of mounting only one set of conversion circuit 33 and coil 37 to the sub-board 73, two or more sets may be mounted thereto.

Alternatively, for example, instead of fixing the first coil 17 or the second coil 27 to the main board 71, they may be fixed to the transformer core 50, and only the third coil 37 may be made positionally adjustable.

Alternatively, for example, the positional relationship between the main board 71 and the sub-board 73 may be reversed in the first embodiment, so that, contrary to the first embodiment, the board-to-board distance D increases with the interposition of the spacer 77 between the main board 71 and the housing 60, and decreases with the interposition of the spacer 77 between the sub-board 73 and the housing 60.

Alternatively, for example, instead of using the spacer 77 in the first embodiment, a plurality of housings 60 may be prepared each having a different step, i.e., a different vertical distance between the first and second support portions 61 and 62, from others, so that the board-to-board distance D can be adjusted by changing the housing 60.

Alternatively, for example, instead of using the heat dissipation elements 81, 82, 83 in the first embodiment, a heat dissipation portion, which abut against the board 71 and 73 or an object mounted thereto, may be integrally formed in the housing 60. In this case, only when interposing the spacer 77 between the board 71, 73 and the support portion 61, 62, a heat dissipation element with a thickness equal to that of the spacer 77 may be interposed between the board 71, 73 and the heat dissipation portion.

Alternatively, for example, instead of making the sub-board 73 adjustable in position in the horizontal direction in the third embodiment, the third coil 37 may be fixed to the sub-board 73, with the center thereof eccentric from the center of the third board hole 73a, so that, when the sub-board 73 is mounted upside down, the position of the third coil 37 is shifted in the horizontal direction.

Alternatively, for example, although the coil board 72 is fixed to the lower surface of the main board 71 in each embodiment as viewed in the figure, the coil board 72 may be fixed to the upper surface of the main board 71. Furthermore, in the case of fixing the coil board 72 to the lower or upper surface of the main board 71, a spacer may be interposed between the main board 71 and the coil board 72. The thickness of the spacer may be selected as appropriate. As described above, the position of the second coil 27 can be adjusted with respect to the positions of the first and third coils 17 and 37. Accordingly, in the three coils 17, 27, 37, flexibility can be increased in terms of relative position and magnetic coupling degree.

The present disclosure has been described based on some embodiments; however, the present disclosure should not be construed as being limited to these embodiments or structures. The scope of the present disclosure should encompass various modifications or equivalents. In addition, various combinations or modes, and further, other combinations or modes including one or more additional elements or fewer elements of the various combinations or modes should also be included within the category or idea of the present disclosure.

What is claimed is:

1. A power converter comprising:
a housing provided with a predetermined first support portion and a second support portion, with a step formed between the first support portion and the second support portion,
a predetermined first board in which a predetermined first board hole is formed, the first board being fixed to the second support portion in a state in which a predetermined transformer core is inserted into the first board hole to determine a position of a predetermined first coil relative to a second coil;
a second board in which a second board hole is formed, the second board being fixed to the first support portion in a state in which the transformer core is inserted into the second board hole;
a plurality of ports provided to the housing;
a plurality of conversion circuits provided to the respective ports, each of the plurality of conversion circuits being electrically connected to a corresponding one of the ports and performing conversion between DC or AC used on the port side and AC having a predetermined frequency to transmit AC power having the predetermined frequency between the coils, using magnetic coupling, and to perform transformation with the transmission, and the plurality of conversion circuits including a predetermined first conversion circuit mounted to the first board and a second conversion circuit mounted to the second board; and
a plurality of coils provided to the respective conversion circuits, each of the plurality of coils being electrically connected to a corresponding one of the conversion circuits and wound around the transformer core, the plurality of coils including the first coil electrically connected to the first conversion circuit and the second coil electrically connected to the second conversion circuit, the first coil being fixed along the first board hole of the first board, in a state in which the first coil moves together with the first board, and the second coil being fixed along the second board hole of the second board, in a state in which the second coil moves together with the second board.

2. The power converter according to claim 1, wherein the first conversion circuit includes a semiconductor switch, and the semiconductor switch is mounted to the first board; and a heat dissipation element is provided at a position aligning with the semiconductor switch in plan view of the first board in a penetration direction of the first board hole, the heat dissipation element abutting against the first board or an object mounted to the first board, while abutting against the housing.

3. A power converter comprising:
a housing;
a predetermined first board in which a predetermined first board hole is formed, the first board being fixed to the housing in a state in which a predetermined transformer core is inserted into the first board hole to determine a position of a predetermined first coil relative to a second coil;
a plurality of ports provided to the housing;
a plurality of conversion circuits provided to the respective ports, each of the plurality of conversion circuits being electrically connected to a corresponding one of the ports and performing conversion between DC or AC used on the port side and AC having a predetermined frequency to transmit AC power having the predetermined frequency between the coils, using magnetic coupling, and to perform transformation with the transmission, and the plurality of conversion circuits including a predetermined first conversion circuit mounted to the first board, the first conversion circuit including a semiconductor switch mounted to the first board;
a plurality of coils provided to the respective conversion circuits, each of the plurality coils being electrically connected to a corresponding one of the conversion circuits and wound around a predetermined transformer core, the plurality of coils including the first coil electrically connected to the first conversion circuit and the second coil, the first coil being fixed along the first board hole of the first board, in a state in which the first coil moves together with the first board; and
a heat dissipation element provided at a position aligning with the semiconductor switch in plan view of the first board in a penetration direction of the first board hole, the heat dissipation element abutting against the first board or an object mounted to the first board, while abutting against the housing.

4. The power converter according to claim 1, wherein the first board is mounted to the housing to thereby be capable of adjusting a position of the first board relative to the transformer core and the second coil in a direction orthogonal to a penetration direction of the first board hole.

5. The power converter according to claim 3, wherein the first board is mounted to the housing to thereby be capable of adjusting a position of the first board relative to the transformer core and the second coil in a direction orthogonal to a penetration direction of the first board hole.

6. A power converter comprising:
a housing;
a predetermined first board in which a predetermined first board hole is formed, the first board being mounted to the housing in a state in which a predetermined transformer core is inserted into the first board hole to thereby be capable of adjusting a position of the first board relative to the transformer core and a second coil in a direction orthogonal to a penetration direction of the first board hole, and the first board being fixed to the housing to determine a position of a predetermined first coil relative to the second coil;
a plurality of ports provided to the housing;

a plurality of conversion circuits provided to the respective ports, each of the plurality of conversion circuits being electrically connected to a corresponding one of the ports and performing conversion between DC or AC used on the port side and AC having a predetermined frequency to transmit AC power having the predetermined frequency between the coils, using magnetic coupling, and to perform transformation with the transmission, and the plurality of conversion circuits including a predetermined first conversion circuit mounted to the first board; and a plurality of coils provided to the respective conversion circuits, each of the plurality coils being electrically connected to a corresponding one of the conversion circuits and wound around a predetermined transformer core, the plurality of coils including the first coil electrically connected to the first conversion circuit and the second coil, the first coil being fixed along the first board hole of the first board, in a state in which the first coil moves together with the first board.

7. The power converter according to claim 3, wherein
the power converter further comprises a second board in which a second board hole is formed;
the plurality of conversion circuits further include a second conversion circuit mounted to the second board;
the plurality of coils further include a second coil electrically connected to the second conversion circuit, and the second coil is fixed along the second board hole of the second board, in a state in which the second coil moves together with the second board; and
the second board is fixed to the housing in a state in which the transformer core is inserted into the second board hole.

8. The power converter according to claim 6, wherein
the power converter further comprises a second board in which a second board hole is formed;
the plurality of conversion circuits further include a second conversion circuit mounted to the second board;
the plurality of coils further include a second coil electrically connected to the second conversion circuit, and the second coil is fixed along the second board hole of the second board, in a state in which the second coil moves together with the second board; and
the second board is fixed to the housing in a state in which the transformer core is inserted into the second board hole.

9. The power converter according to claim 3, wherein a spacer is interposed between the first board and the housing to increase or decrease a distance between the first coil and the second coil, compared to the case where there is no interposition of the spacer.

10. The power converter according to claim 6, wherein a spacer is interposed between the first board and the housing to increase or decrease a distance between the first coil and the second coil, compared to the case where there is no interposition of the spacer.

11. The power converter according to claim 1, wherein a spacer is interposed between the first board and the housing or between the second board and the housing to increase or decrease a distance between the first coil and the second coil, compared to the case where there is no interposition of the spacer.

12. The power converter according to claim 7, wherein a spacer is interposed between the first board and the housing or between the second board and the housing to increase or decrease a distance between the first coil and the second coil, compared to the case where there is no interposition of the spacer.

13. The power converter according to claim 8, wherein a spacer is interposed between the first board and the housing or between the second board and the housing to increase or decrease a distance between the first coil and the second coil, compared to the case where there is no interposition of the spacer.

14. The power converter according to claim 1, wherein
a first spacer is interposed between the first board and the housing to increase a distance between the first coil and the second coil, compared to the case where there is no interposition of the spacer, and
a second spacer is interposed between the second board and the housing to decrease a distance between the first coil and the second coil, compared to the case where there is no interposition of the spacer.

15. The power converter according to claim 7, wherein
a first spacer is interposed between the first board and the housing to increase a distance between the first coil and the second coil, compared to the case where there is no interposition of the spacer, and
a second spacer is interposed between the second board and the housing to decrease a distance between the first coil and the second coil, compared to the case where there is no interposition of the spacer.

16. The power converter according to claim 8, wherein
a first spacer is interposed between the first board and the housing to increase a distance between the first coil and the second coil, compared to the case where there is no interposition of the spacer, and
a second spacer is interposed between the second board and the housing to decrease a distance between the first coil and the second coil, compared to the case where there is no interposition of the spacer.

* * * * *